United States Patent
Hwang et al.

(10) Patent No.: US 12,061,212 B2
(45) Date of Patent: Aug. 13, 2024

(54) SPRING CONTACT AND SOCKET HAVING SPRING CONTACT EMBEDDED THEREIN

(71) Applicants: Dong Weon Hwang, Gyeonggi-do (KR); Logan Jae Hwang, Flower Mound, TX (US); Jae Baek Hwang, Seoul (KR); HICON CO., LTD., Gyeonggi-do (KR)

(72) Inventors: Dong Weon Hwang, Gyeonggi-do (KR); Logan Jae Hwang, Flower Mound, TX (US); Jae Baek Hwang, Seoul (KR)

(73) Assignees: DONG WEON HWANG, Seongnam-si (KR); LOGAN JAE HWANG, Seongnam-si (KR); JAE BAEK HWANG, Seongnam-si (KR); HICON CO., LTD., Seongnam-si (KR)

( * ) Notice: Subject to any disclaimer, the term of this patent is extended or adjusted under 35 U.S.C. 154(b) by 273 days.

(21) Appl. No.: 17/609,912

(22) PCT Filed: Jun. 5, 2019

(86) PCT No.: PCT/KR2019/006771
§ 371 (c)(1),
(2) Date: Nov. 9, 2021

(87) PCT Pub. No.: WO2020/230945
PCT Pub. Date: Nov. 19, 2020

(65) Prior Publication Data
US 2022/0206041 A1 Jun. 30, 2022

(30) Foreign Application Priority Data
May 15, 2019 (KR) .......................... 10-2019-0057029

(51) Int. Cl.
*G01R 1/04* (2006.01)
*G01R 1/067* (2006.01)
*G01R 31/28* (2006.01)

(52) U.S. Cl.
CPC ....... *G01R 1/0441* (2013.01); *G01R 1/06722* (2013.01); *G01R 31/2886* (2013.01)

(58) Field of Classification Search
CPC .............. G01R 1/0441; G01R 1/06722; G01R 31/2886; G01R 1/0466; G01R 1/07314; G01R 1/0483
See application file for complete search history.

(56) References Cited

U.S. PATENT DOCUMENTS

| | | | | |
|---|---|---|---|---|
| 7,874,863 B1* | 1/2011 | Hwang | ................ | G01R 1/0466 439/73 |
| 2005/0001637 A1* | 1/2005 | Kazama | ............... | H05K 7/1053 324/756.01 |

(Continued)

FOREIGN PATENT DOCUMENTS

| | | |
|---|---|---|
| CN | 108450012 A | 8/2018 |
| JP | 2001185259 A | 7/2001 |

(Continued)

OTHER PUBLICATIONS

International Search Report issued by ISA/KR issued in connection with PCT/KR2019/006771 dated Feb. 12, 2020.

(Continued)

*Primary Examiner* — Alvaro E Fortich
(74) *Attorney, Agent, or Firm* — Klintworth & Rozenblat IP LLP

(57) ABSTRACT

The present disclosure relates to a socket having a thin structure and to a spring contact suitable thereto. The socket includes: a plurality of spring contacts (100) each of which includes an upper contact pin (110), a lower contact pin (120) assembled to the upper contact pin such that the upper (Continued)

and lower contact pins cross each other to mutually linearly operate, and a coil spring (130) supporting the upper and lower contact pins (110 and 120); a lower film plate (310) including a plurality of first through-holes (311) through which the respective spring contacts (100) are positioned; an intermediate plate (320) provided on the lower film plate (310) and including second through-holes formed at positions corresponding to the first through-holes (311); and an upper film plate (330) provided on the intermediate plate (320) and including third through-holes formed at positions corresponding to the second through-holes.

10 Claims, 15 Drawing Sheets

(56) References Cited

U.S. PATENT DOCUMENTS

| | | | | |
|---|---|---|---|---|
| 2009/0275220 A1* | 11/2009 | Hwang | ............... | G01R 1/0466 439/73 |
| 2012/0238136 A1* | 9/2012 | Hwang | ............. | G01R 1/06722 439/700 |
| 2015/0377924 A1* | 12/2015 | Hwang | ............. | G01R 31/2601 324/756.02 |
| 2018/0188290 A1* | 7/2018 | Park | ....................... | H05K 3/285 |

FOREIGN PATENT DOCUMENTS

| | | |
|---|---|---|
| JP | 2003163047 A | 6/2003 |
| JP | 2003307542 A | 10/2003 |
| JP | 2018529932 A | 10/2018 |
| KR | 100253401 B1 | 4/2000 |
| KR | 20080023028 A | 3/2008 |
| KR | 101058146 B1 | 8/2011 |
| KR | 101154519 B1 | 12/2011 |
| KR | 101683017 B | 12/2016 |
| KR | 101953104 B1 | 3/2019 |
| TW | 1360922 B | 3/2012 |
| TW | 201443452 A | 11/2014 |
| TW | 201913104 A | 4/2019 |

OTHER PUBLICATIONS

Written Opinion issued by ISA/KR issued in connection with PCT/KR2019/006771 dated Feb. 12, 2020.
International Preliminary Report on Patentability issued by WIPO in connection with PCT/KR2019/006771 dated Nov. 16. 2021.

* cited by examiner

FIG. 10(a)
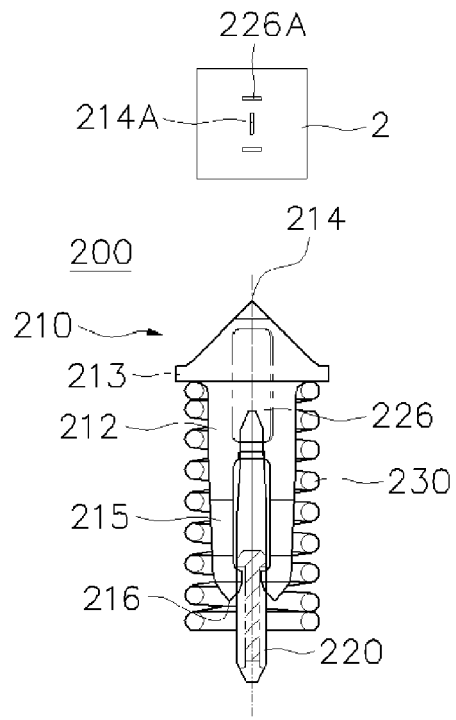
FIG. 10(b)
FIG. 10(c)
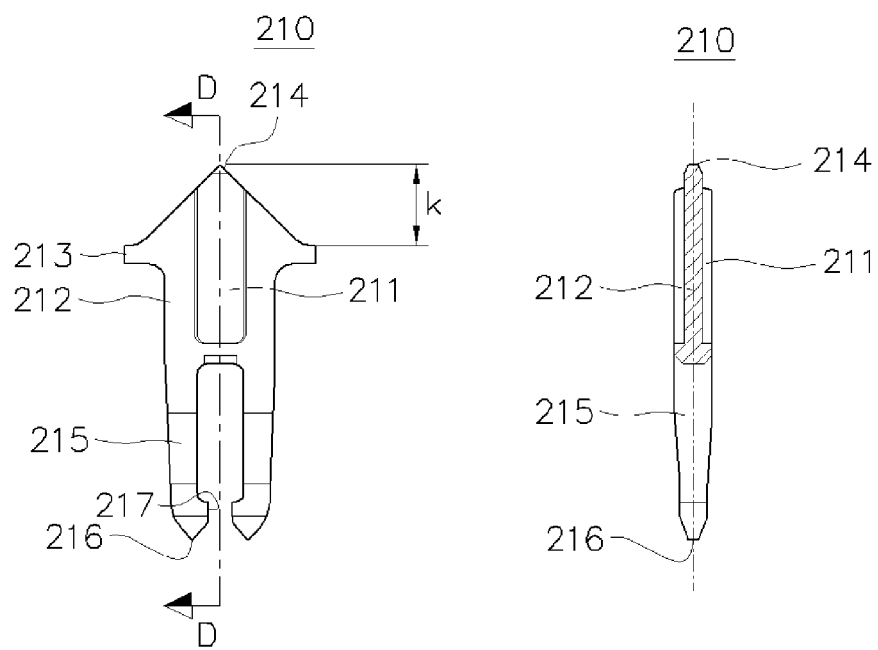

FIG. 11(a)
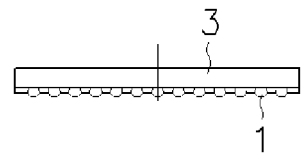
FIG. 11(b)
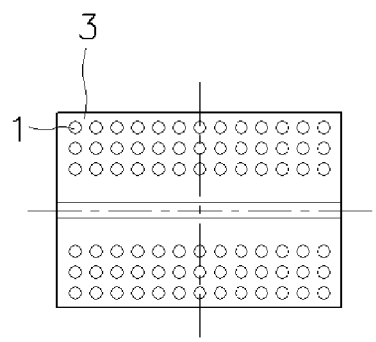
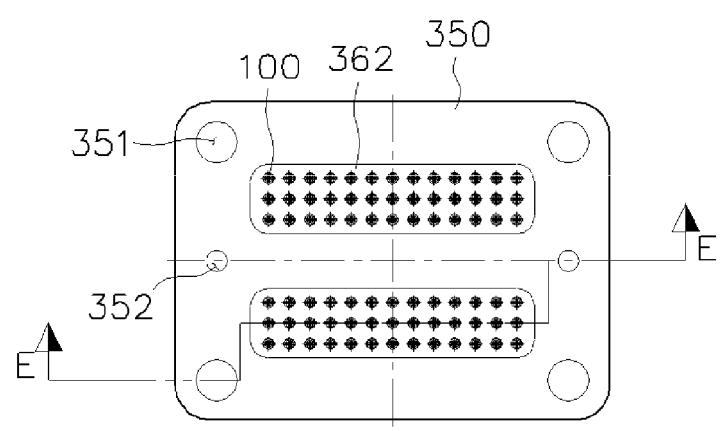
FIG. 12

FIG. 15(a)
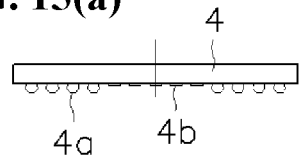
FIG. 15(b)
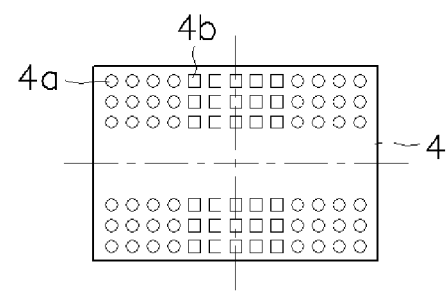
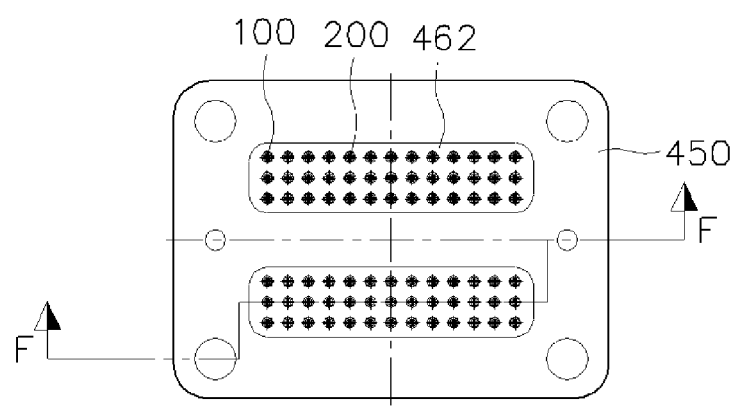
FIG. 16

SPRING CONTACT AND SOCKET HAVING SPRING CONTACT EMBEDDED THEREIN

This is a National Stage Application of International Patent Application No. PCT/KR2019/006771, filed Jun. 5, 2019, which claims the benefit of and priority to Korean Application No. 10-2019-0057029, filed May 15, 2019, the entireties of which are incorporated fully herein by reference.

TECHNICAL FIELD

The present disclosure relates generally to a spring contact and a socket having spring contact embedded therein. More particularly, the present disclosure relates to a spring contact that electrically connects each of a plurality of leads of an integrated circuit (IC) to an associated one of a plurality of pads of a printed circuit board (PCB) for the test of the performance of the IC or electrically connects each of leads of an IC such as a central processing unit (CPU) to a PCB of an electronic appliance such as a personal computer (PC) or a mobile phone, and relates to a socket with the same.

BACKGROUND ART

In general, spring contacts serve to electrically connect a PCB with leads of an IC, and are essential components of a socket for testing ICs.

FIGS. 1 to 3 illustrate a spring contact in the related art, and FIGS. 4 and 5 illustrate a socket with a spring contact.

FIGS. 1(a) and 1(b) are respectively a perspective view and an exploded perspective view illustrating a spring contact in the related art. The spring contact includes an upper contact pin 10, a lower contact pin 20 assembled to the upper contact pin 10 in such a manner that the upper and lower contact pins cross each other in longitudinal directions thereof, and a spring 30 fitted over the upper and lower contact pins 10 and 20 at a position therebetween to elastically support the upper and lower contact pins 10 and 20.

FIGS. 2(a) and 2(b) are respectively a plan view illustrating the upper contact pin 10 in the related art and a sectional view taken along line A-A. The upper contact pin 10 includes a contact portion 11 protruding from an upper end of the upper contact pin, a pair of fixing protrusions 12 protruding from left and right sides of the upper contact pin 10, a body portion 13 including a flow groove 13a recessed in a longitudinal direction thereof, a pair of elastic portions 14 extending symmetrically from the body portion 13, and a locking protrusion 15 provided at an end of each of the elastic portions 14. Meanwhile, the lower contact pin 20 has the same shape as the upper contact pin 10.

FIGS. 3(a) and 3(b) are respective views illustrating an operation example of the spring contact in the related art, in which the left and right views of FIG. 3(a) illustrate respectively before and after compression of the spring 30, and the left and right views of FIG. 3(b) illustrate in plan view the position between the upper and lower contact pins 10 and 20 before and after the compression of the spring 30.

Referring to FIGS. 3(a) and 3(b), the upper contact pin 10 and the lower contact pin 20 are assembled together with the spring 30 fitted thereover in such a manner that the elastic portions 14 and 24 are perpendicular to each other in the longitudinal directions of the contact pins. In detail, the respective locking protrusions 15 of the upper contact pin 10 are inserted into a flow groove 23a of the lower contact pin 20 and locking protrusions 25 of the lower contact pin 20 are inserted into the flow groove 13a of the upper contact pin 10. Therefore, when an external force acts in a longitudinal direction of the spring contact, the locking protrusions 15 and 25 are moved along the flow grooves 13a and 23a while the upper contact pin 10 and the lower contact pin 20 are compressed by a predetermined length S.

Referring to FIG. 3(a), the maximum displacement (Smax) between the upper contact pin 10 and the lower contact pin 20 is determined by the position (left view) where the locking protrusions 15 and 25 of the upper and lower contact pins 10 and 20 are supported at the ends of the opposing flow grooves 13a and 23a before the spring 30 is compressed, and the position (right view) where end portions 13b and 23b of the bodies 13 and 23 of the upper and lower contact pins 10 and 20 come into contact with each other in a compressed state of the spring 30.

FIG. 4 is a plan view illustrating the socket in the related art, and FIG. 5 is a sectional view taken along line B-B of FIG. 4.

Referring to FIGS. 4 and 5, the socket in the related art includes an upper plate 40 and a lower plate 50 assembled to the upper plate 40 by fitting, with a spring contact 1 fixed between the upper plate 40 and the lower plate 50.

The upper plate 40 and the lower plate 50 respectively include receiving holes 41 and 51 to which the spring contact 1 is fixed. The spring contact 1 is located in the receiving holes 41 and 51 between the upper and lower plates 40 and 50 such that upper and lower ends thereof protrude outside the receiving holes 41 and 51, and serves to electrically connect a lead of an IC and a pad of a PCB to each other.

The socket in the related art is manufactured in such a manner that the upper and lower plates 40 and 50 are made of synthetic resin. In particular, at the upper plate 40, a flange portion 42 in which the first receiving hole 41 is formed is provided by protruding from the upper plate 40 by a predetermined height such that the spring contact 1 of a predetermined height is received therein.

Therefore, in a manufacturing a thin-type plate having the above flange portion in which the first receiving hole by injection molding with synthetic resin, a high processing cost is required. Also, there is a limitation in manufacturing a plate having a thickness of equal to or less than 1.0 mm, and, due thereto, it is difficult to manufacture a test socket for high speed use for processing a high-speed signal of equal to or greater than 40 GHz.

On the other hand, as another related art technology, a rubber-type socket is used. The rubber-type socket may include a stretchable insulating body having an insulating silicone powder solidified therein, and a conductive silicone portion formed in the insulating body by vertically passing therethrough at a position corresponding to a lead of an IC.

The rubber-type socket may be manufactured in such a manner that when a silicone mixture containing insulating silicone and conductive powder in a predetermined ratio is placed into a mold and a strong magnetic field is formed at a position where the conductive silicone portion is to be formed, the conductive powder of the silicon mixture is collected at the position where the magnetic field is formed and finally a molten silicone mixture is solidified to form an array of conductive silicone portions in the insulating body.

The rubber-type socket is disadvantageous in that the speed of elastic response may be slower than that of a pin-type contact (spring contact) and the elasticity may be lost in the course of a repeated test process, which may result in a short service life and increased costs due to frequent replacement. In addition, due to the characteristics that the elasticity persistence decreases over time, the elastic repulsive force may become zero or remarkably low during continuous compression test for a long period of time (more than one week), and thus a short circuit may occur, which may make it difficult to use the rubber-type socket for long term testing.

Moreover, the rubber-type socket is problematic in that the elastic characteristics may be affected greatly by the temperature, and the uniformity of the resistance characteristics of the individual conductive silicone portions may be inferior.

DOCUMENTS OF RELATED ART

Patent Document

1. Korean Patent Application Publication No. 10-2011-0051668 (published on May 18, 2011)

DISCLOSURE

Technical Problem

Accordingly, the present disclosure has been made keeping in mind the above problems occurring in the related art, and an objective of the present disclosure is to provide a socket having a thin structure that can reduce durability degradation of a contact itself, can have excellent electrical characteristics in processing high-speed signals, and can extend a service life thereof, and to provide a spring contact suitable thereto.

Technical Solution

In order to achieve the above objective, according to one aspect of the present disclosure, there is provided a socket, including: a plurality of spring contacts each of which includes an upper contact pin, a lower contact pin assembled to the upper contact pin such that the upper and lower contact pins cross each other to mutually linearly operate, and a coil spring elastically supporting the upper and lower contact pins; a lower film plate including a plurality of first through-holes through which the respective spring contacts are positioned; an intermediate plate provided on an upper surface of the lower film plate and including second through-holes formed at positions corresponding to the first through-holes; and an upper film plate provided on an upper surface of the intermediate plate and including third through-holes formed at positions corresponding to the second through-holes.

According to another aspect of the present disclosure, there is provided a spring contact, including: an upper contact pin; a lower contact pin assembled to the upper contact pin such that the upper and lower contact pins cross each other; and a coil spring elastically supporting the upper and lower contact pins, wherein the upper contact pin and the lower contact pin may be plate-shaped contact pins having the same shape and fulfill a relationship of length L1>width w1>thickness t1.

Each of the upper and lower contact pins may include: a body portion including a groove that is recessed in each of opposite surfaces thereof in a longitudinal direction thereof, each of the respective grooves being configured such that one end thereof is open while the other end thereof has a hook locking step having a step height; a pair of shoulder protrusions protruding from left and right side ends of the body portion to support the coil spring; a first end contact portion extending from an upper end of the body portion; a pair of elastic portions extending in the longitudinal direction of the body portion to be bilaterally symmetrical to each other, and each of which includes a guide surface protruding inward from an end portion of each of the elastic portions such that the respective guide surfaces face each other; and a second end contact portion extending from an end of each of the elastic portions, wherein each of neighboring lower end edges of the body portion between the elastic portions may include a chamfered inclined surface having an inclination, and each of the first end contact portion and the second end contact portion may include an edge line formed by two different curved surfaces or inclined contact surfaces that are in contact with each other; a thickness t2 of the body portion in a section where the respective grooves are formed may be equal to or less than a width w3 between the guide surfaces, the width w3 between the guide surfaces may be less than a thickness t1 of the body portion, and a length L3 of the elastic portions including the respective second end contact portions may be greater than a length L2 from the first end contact portion to a lower end of the body portion; and the two elastic portions of the upper contact pin and the two elastic portions of the lower contact pin may be fitted to cross each other so that the guide surfaces of the upper contact pin may come into contact with the grooves of the lower contact pin and the guide surfaces of the lower contact pin may come into contact with the grooves of the upper contact pin, and a total length of the spring contact may be equal to a length L1 of a single contact pin when the coil spring is compressed.

Advantageous Effects

The socket according to the present disclosure includes the plurality of spring contacts each of which includes the upper contact pin and the lower contact pin that are assembled to cross each other and elastically supported to each other to mutually linearly operate, and a plurality of plate units in which the spring contacts are inserted and positioned therethrough. Preferably, a part of the plate units is made of an elastomer and thus is easy to manufacture in a thin structure. Therefore, it is possible to obtain excellent electrical characteristics in processing high-speed signals, and extend a service life of the socket.

Furthermore, the spring contact according to the present disclosure is configured such that a pair of contact pins having the same shape are assembled to cross each other and elastically supported to each other to be movable linearly, thereby making it possible to manufacture a spring contact having a total length of equal to or less than 1.0 mm. Therefore, the spring contact can be suitable for testing ICs for high-speed signal processing due to minimized electrical resistance.

DESCRIPTION OF DRAWINGS

FIGS. 10(a), 10(b), and 10(c) are views illustrating a spring contact according to another embodiment of the present disclosure;

FIGS. 11(a) and 11(b) are respectively a side view and a rear view illustrating a BGA-type IC;

FIG. 12 is a plan view illustrating a socket according to an embodiment of the present disclosure;

FIGS. 15(a) and 15(b) are respectively a side view and a rear view illustrating a hybrid IC in which a BGA type and a LGA type are mixed;

FIG. 16 is a plan view illustrating a test according to another embodiment of the present disclosure.

BEST MODE

All terms or words used in the specification and claims have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Accordingly, one or more embodiments and configurations illustrated in drawings are only exemplary embodiments, and do not represent all technical aspects of the present disclosure. Thus, it should be understood that there may be various equivalents and changes capable of replacing the one or more exemplary embodiments.

Hereinafter, exemplary embodiments of the present disclosure will be described in detail with reference to the accompanying drawings.

Figure 1B:
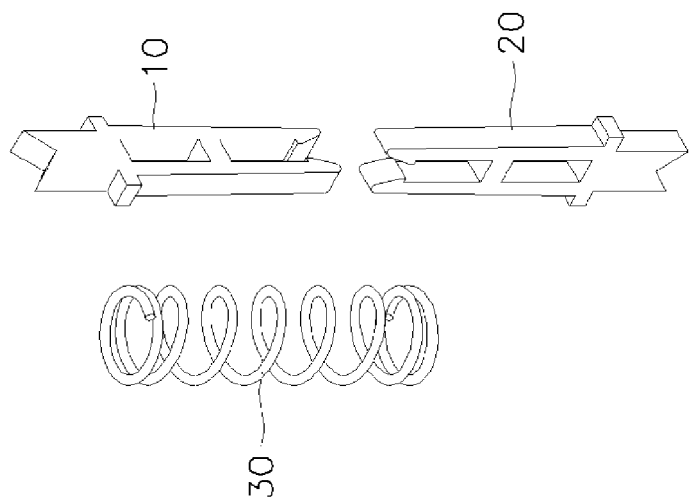
FIGS. 1(a) and 1(b) are respectively a perspective view and an exploded perspective view illustrating a spring contact in the related art.
Figure 1A:
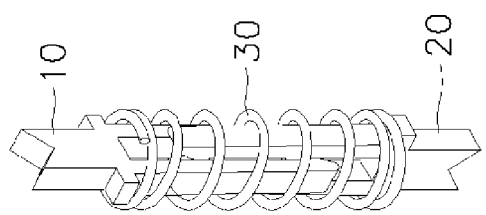
Figure 2A:
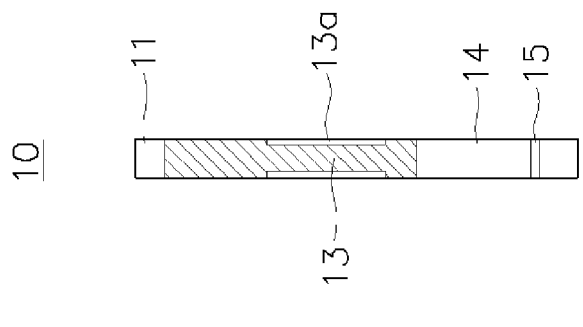
FIGS. 2(a) and 2(b) are respectively a plan view illustrating an upper contact pin in the related art and a sectional view taken along line A-A.
Figure 2B:
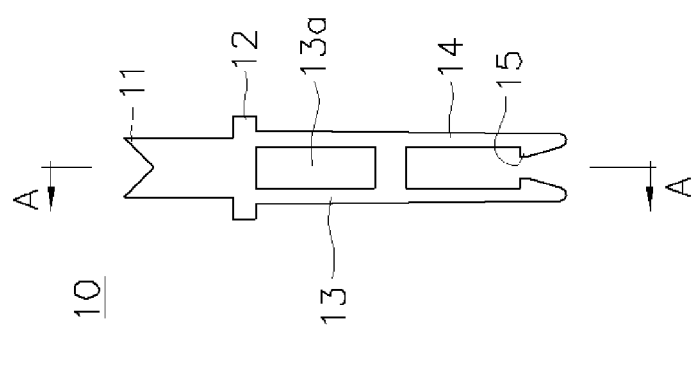
Figure 3A:
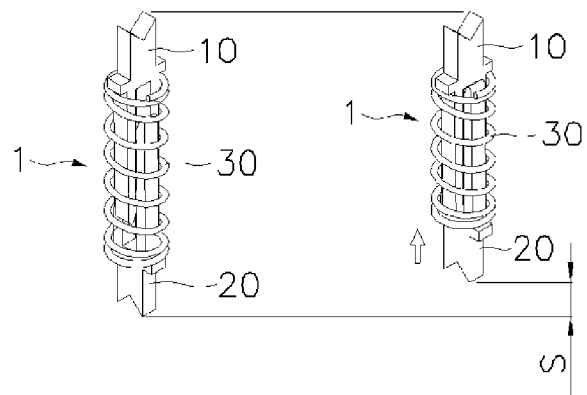
FIGS. 3(a) and 3(b) are views illustrating an operation example of the spring contact in the related art.
Figure 3B:
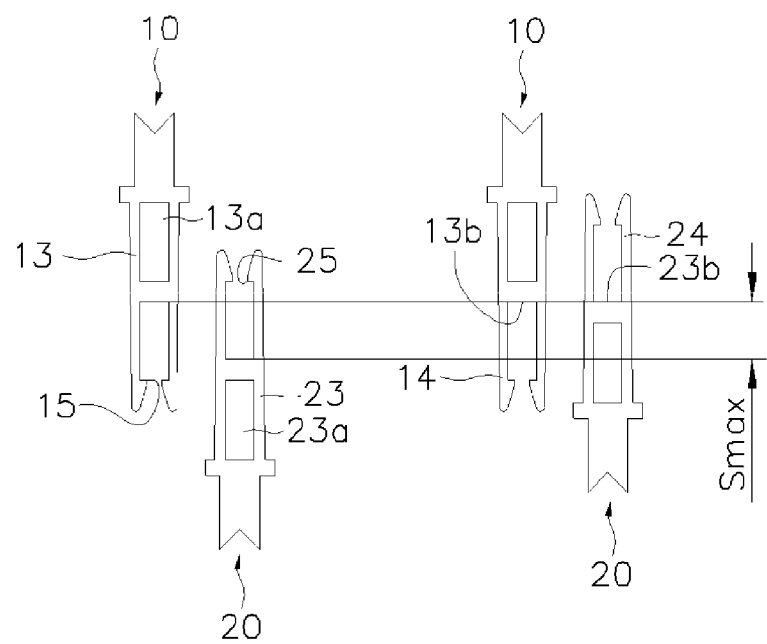
Figure 4:
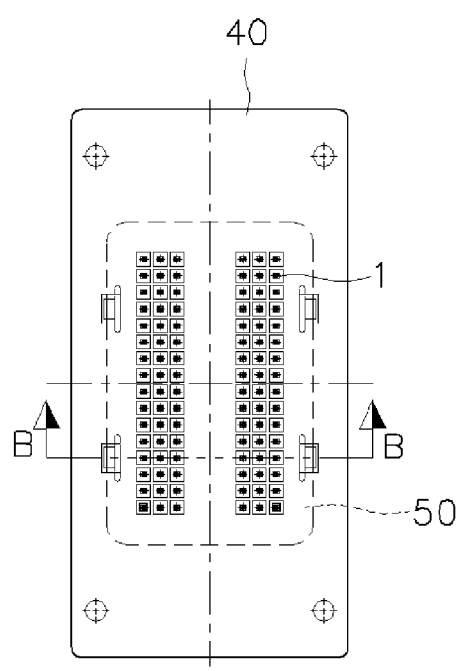
FIG. 4 is a plan view illustrating a socket in the related art.
Figure 5:
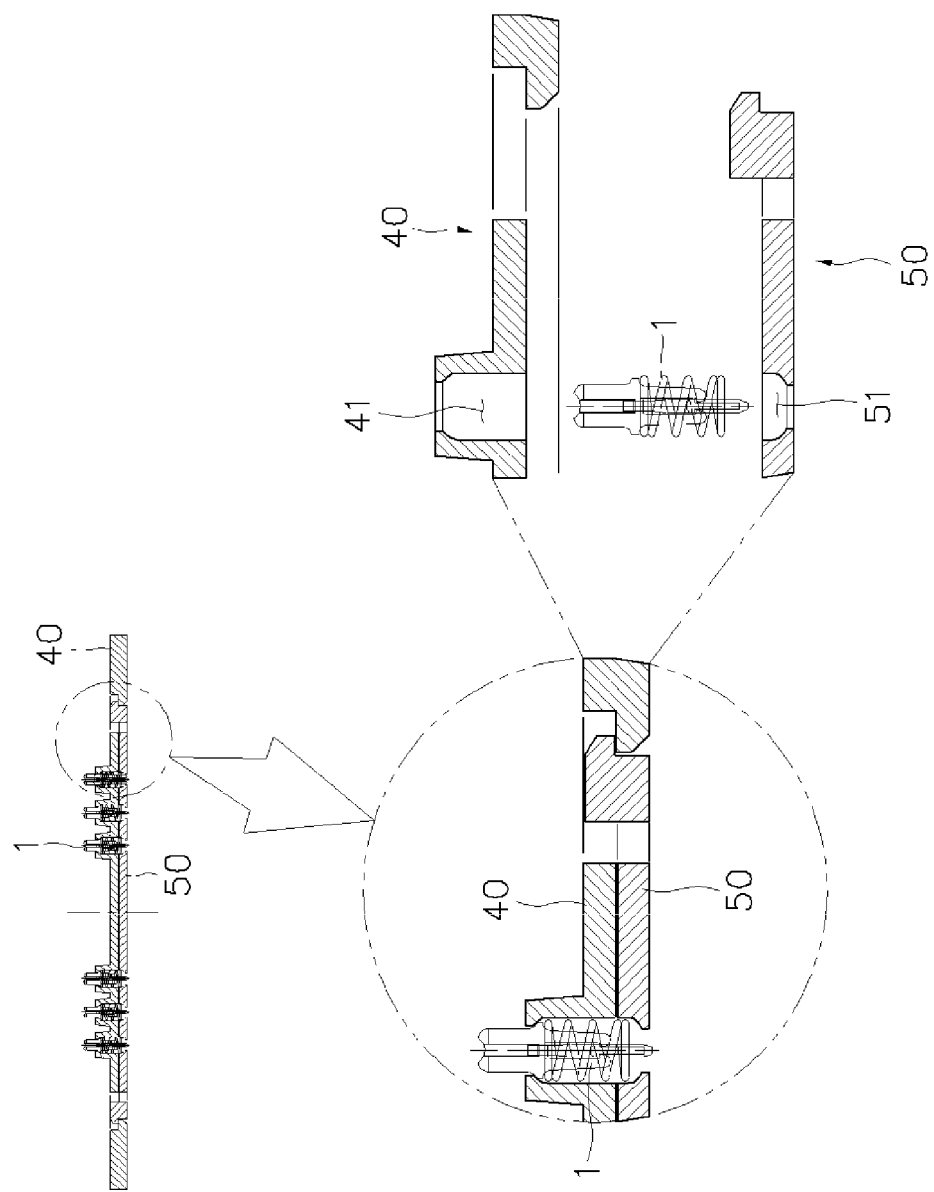
FIG. 5 is a sectional view taken along line B-B in FIG. 4.
Figure 6:
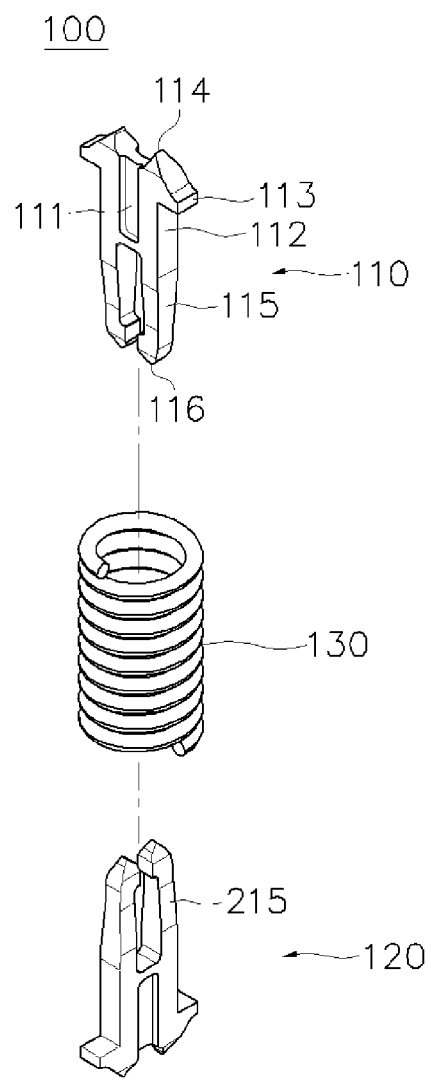
FIG. 6 is an exploded perspective view illustrating a spring contact according to an embodiment of the present disclosure.

FIG. 6 is an exploded perspective view illustrating a spring contact according to an embodiment of the present disclosure. A spring contact 100 of the present embodiment includes an upper contact pin 110, a lower contact pin 120 assembled to the upper contact pin 110 such that the upper and lower contact pins 110 and 120 cross each other, and a spring 130 elastically supporting the upper and lower contact pins 110 and 120.

In particular, the upper contact pin 110 and the lower contact pin 120 according to the present disclosure are configured as contact pins having the same size and shape. Two contact pins 110 and 120 assembled to cross each other in longitudinal directions thereof are divided into upper and lower contact pins depending on the assembly position. Therefore, in the following description, the upper contact pin 110 will be described mainly.

The spring 130 is configured as a coiled compression spring that resists the compressive force. The spring 130 is provided between the upper contact pin 110 and the lower contact pin 120 to provide a restoring force for returning the upper contact pin 110 and the lower contact pin 120 to original positions thereof when the upper contact pin 110 and the lower contact pin 120 are compressed in the longitudinal directions thereof.

Figure 7A:
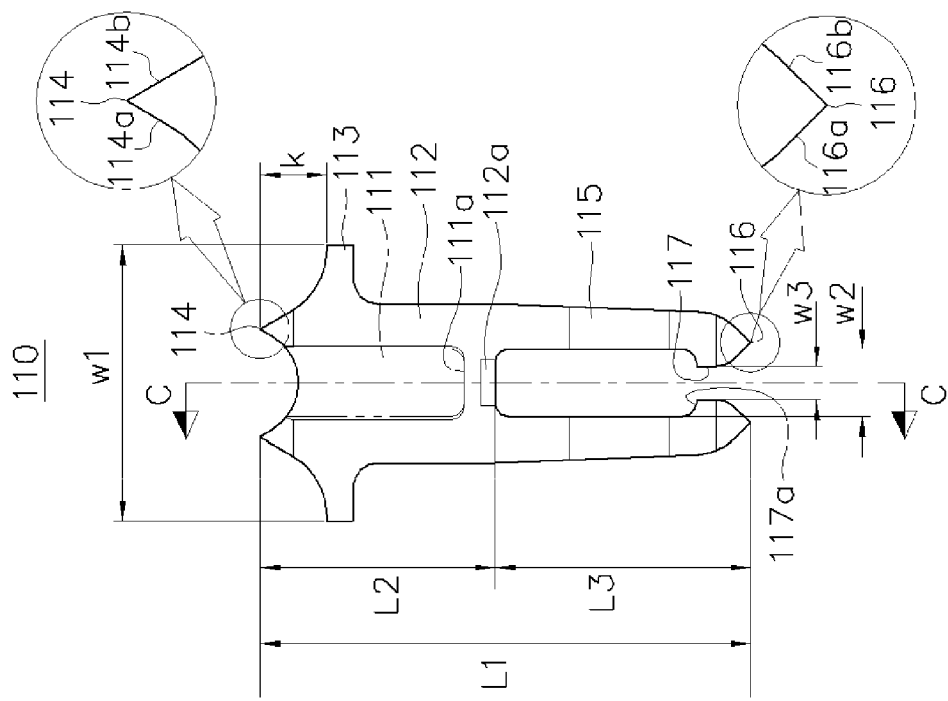
FIGS. 7(a) and 7(b) are respectively a plan view and a side view illustrating an upper contact pin according to the embodiment of the present disclosure.
Figure 7B:
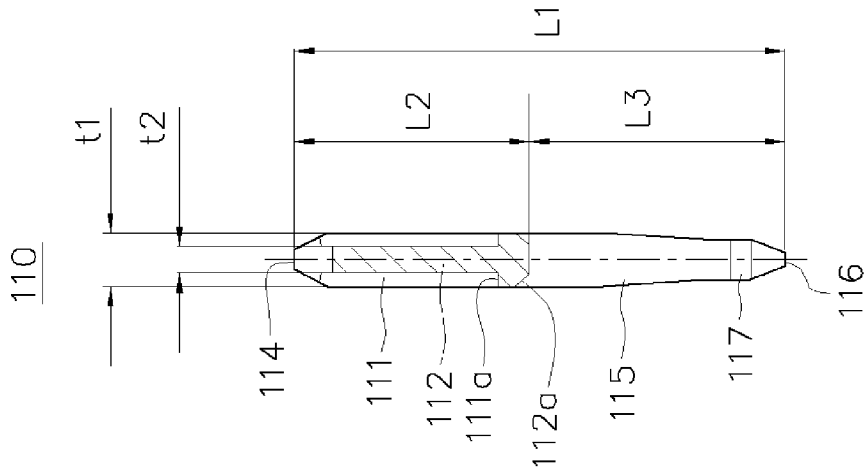

FIGS. 7(a) and 7(b) are respectively a plan view and a side view illustrating the upper contact pin according to the embodiment of the present disclosure.

Referring to FIGS. 7(a) and 7(b), the upper contact pin 110 according to the present embodiment is configured as a plate-shaped contact pin having a predetermined length L1, a predetermined width w1, and a predetermined thickness t1. In detail, the upper contact pin 110 includes a body portion 112 including a groove 111 that is recessed in each of opposite surfaces thereof in a longitudinal direction thereof, a shoulder protrusion 113 formed to protrude vertically from each of left and right side ends of the body portion 112, a pair of first end contact portions 114 integrally extending from opposite sides of an upper end of the body portion 112 to be symmetrical each other with respect to the respective grooves 111, a pair of elastic portions 115 extending in the longitudinal direction of the body portion 112 to be bilaterally symmetrical to each other, a second end contact portion 116 formed at an end of each of the elastic portions 115, and a guide surface 117 protruding inward from an end portion of each of the elastic portions 115 such that the respective guide surfaces 117 face each other.

The body portion 112 is configured such that the groove 111 recessed with a predetermined width and a predetermined depth along the central axis in the longitudinal direction thereof is provided in each of both the opposite surfaces thereof. Each of the respective grooves 111 is configured such that an upper end thereof is open at the upper end of the body portion 112 while a lower end thereof has a hook locking step 111a having a step height. The entire body portion 112 has the predetermined thickness t1, while the body portion 112 in a section where the grooves 111 are formed has a thinner thickness t2 (t2<t1).

The body portion 112 includes a pair of shoulder protrusions 113 protruding to extend from the left and right side ends thereof. These shoulder protrusions 113 support the spring 130. Meanwhile, the maximum width of the upper contact pin 110 is determined by the width w1 between the two shoulder protrusions 113.

The first end contact portions 114 integrally extend from the upper end of the body portion 112 to be bilaterally symmetrical to each other. Preferably, each of the first end contact portions 114 includes an edge line formed by two different contact surfaces that are in contact each other. In the present embodiment, each of the first end contact portions 114 is illustrated that two curved first contact surfaces 114a and 114b are in contact with each other to form an upper edge line. Herein, the contact surfaces may be curved surfaces having a predetermined curvature or inclined surfaces having a predetermined angle of inclination. The first end contact portions 114 are portions that come into line contact with a lead of an IC.

The elastic portions 115 are arranged spaced apart from each other by a predetermined width w2 in the longitudinal direction of the body portion 112 to be bilaterally symmetrical each other. Each of the elastic portions 115 has the end portion provided with the guide surface 117 protruding inward such that the respective guide surfaces 117 face each other. A movement limiting end 117a extending from the end portion of each of the elastic portions 115 to the guide surface 117 acts as a hook to limit upward and downward movement between the two contact pins.

Therefore, a width w3 between the guide surfaces 117 of the respective elastic portions 115 is shorter than the width w2 between the two elastic portions 115 (w3<w2). Preferably, the width w3 between the two guide surfaces 117 is equal to or greater than a thickness t2 of the body portion 112 in the section where the grooves 111 are formed (t2≤w3). In addition, the width w2 between the two elastic portions 115 is equal to or greater than the thickness t1 of the body portion 112 (t1≤w2).

When the upper contact pin and the lower contact pin are assembled, the guide surfaces 117 of the upper contact pin are inserted into grooves of the lower contact pin while guide surfaces of the lower contact pin are inserted into the grooves 111 of the upper contact pin, and each guide surface comes into contact with a bottom surface of each groove to serve to allow the upper and lower contact pins to be electrically connected to each other.

Each of neighboring lower end edges of the body portion 112 between the two elastic portions 115 includes a chamfered inclined surface 112a having an inclination. The chamfered inclined surface 112a serves to facilitate assembly between the elastic portions 115 when the two contact pins are assembled.

The second end contact portion 116 extends vertically from the end of each of the elastic portions 115. Preferably, each of the respective second end contact portions 116 includes an edge line formed by two different contact surfaces that are in contact with each other. In the present embodiment, each of the second end contact portions 116 is illustrated that two curved second contact surfaces 116a and 116b are in contact with each other to form an upper edge line. Herein, the contact surfaces may be curved surfaces having a predetermined curvature or inclined surfaces having a predetermined angle of inclination. The second end contact portions 116 are portions that come into line contact with a lead of an IC.

Preferably, a length L3 of the elastic portions 115 including the second end contact portions 116 is longer than a length L2 from the first end contact portions 114 to the lower end of the body portion 112 (L2<L3).

Figure 8A:
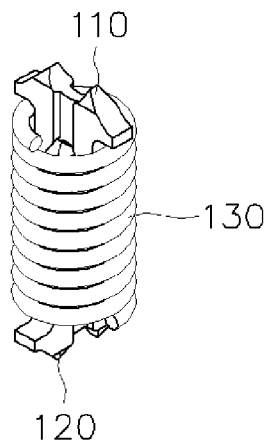
FIGS. 8(a), 8(b), and 8(c) are views illustrating an extended state of the spring contact according to the embodiment of the present disclosure.
Figure 8B:
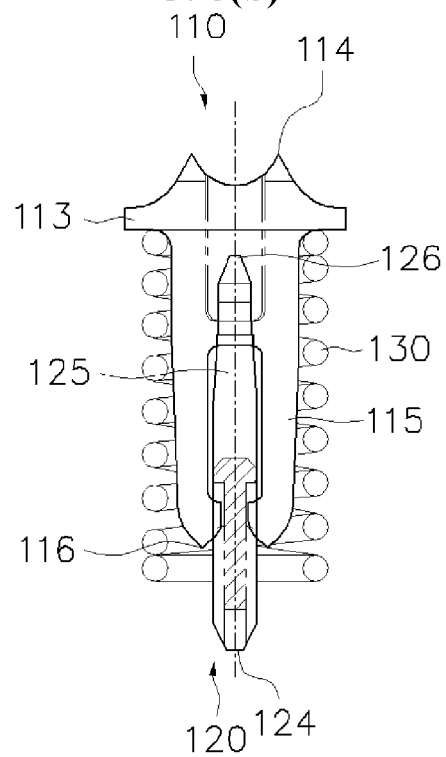
Figure 8C:
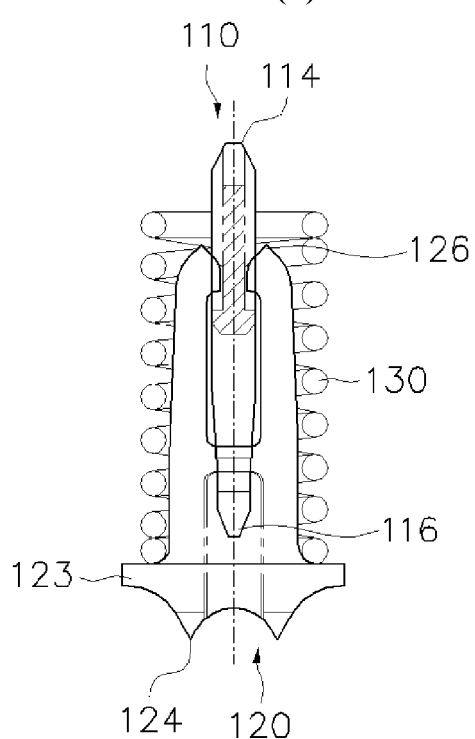

FIGS. 8(a), 8(b), and 8(c) are views illustrating an extended state of the spring contact according to the embodiment of the present disclosure, in which FIG. 8(a) is a perspective view, and FIGS. 8(b) and 8(c) are sectional views in directions perpendicular to each other.

Referring to FIGS. 8(a), 8(b), and 8(c), the upper contact pin 110 and the lower contact pin 120 are assembled in the longitudinal directions thereof such that the respective elastic portions 115 and 125 cross each other, and the spring 130 is supported by the shoulder protrusions 113 and 123 of the upper and lower contact pins 110 and 120 to maintain the upper and lower contact pins 110 and 120 in an extended state.

In such an extended state of the spring contact 100, the first end contact portions 114 of the upper contact pin 110 are exposed outside an upper end of the spring 130, while second end contact portions 126 of the lower contact pin 120 are located inside the spring 130. On the contrary, first end contact portions 124 of the lower contact pin 120 are exposed outside a lower end of the spring 130, while the second end contact portions 116 of the upper contact pin 110 are located inside the spring 130.

Figure 9A:
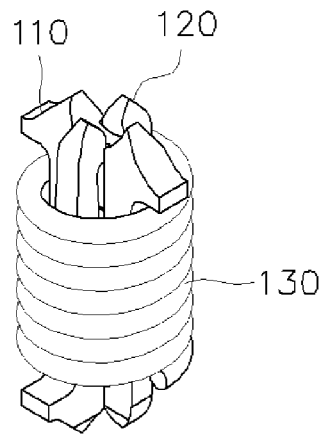
FIGS. 9(a), 9(b), and 9(c) are views illustrating a compressed state of the spring contact according to the embodiment of the present disclosure.
Figure 9B:
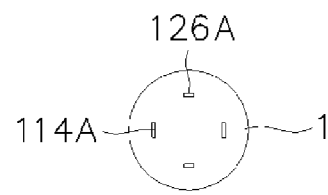
Figure 9C:
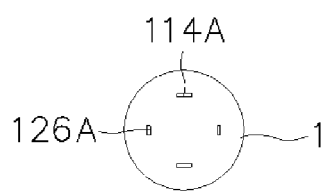
Figure 9C:
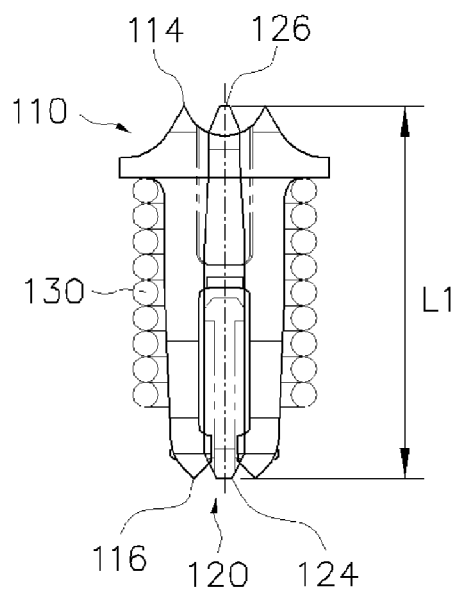
Figure 9C:
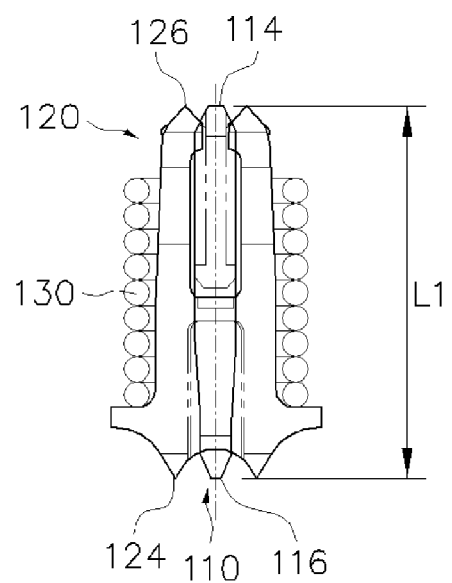

FIGS. 9(a), 9(b), and 9(c) are views illustrating a compressed state of the spring contact according to the embodiment of the present disclosure, in which FIG. 9(a) is a perspective view, and FIGS. 9(b) and 9(c) are sectional views in directions perpendicular to each other. In FIGS. 9(b) and 9(c), an upper view located above the spring contact illustrates a lead ball of an IC in plan view, which illustrates a contact portion between end contact portions and the lead ball.

Referring to FIGS. 9(a), 9(b), and 9(c), a total length L1 of the spring contact 100 in a compressed state is equal to the length L1 of a single contact pin (see FIG. 7). Herein, the first end contact portions 114 of the upper contact pin 110 and the second end contact portions 126 of the lower contact pin 120, which define an upper end portion of the spring contact 100, come into contact with a lead ball 1 of an IC simultaneously at four positions 114A and 126A in directions perpendicular to each other.

Similarly, also in the case of a lower end portion of the spring contact 100, the second end contact portions 116 of the upper contact pin 110 and the first end contact portions 124 of the lower contact pin 120 come into contact with a lead (not illustrated) of a PCB simultaneously.

As described above, the spring contact 100 according to the present disclosure is characterized in that electrical contact of the end contact portions with the lead ball 1 is established at four plural positions in a compressed state of the spring contact. Advantageously, a reduced design of the length L1 of the spring contact is also possible, thereby minimizing electrical resistance.

FIGS. 10(a), 10(b), and 10(c) are views illustrating a spring contact according to another embodiment of the present disclosure, in which FIG. 10(a) is a sectional view, FIG. 10(b) is a plan view illustrating an upper contact pin, and FIG. 10(c) is sectional view taken along line D-D. In FIG. 10(a), an upper view located above the spring contact illustrates a lead 2 of a land-type IC in plan view, which illustrates a contact portion between end contact portions and the lead.

Referring to FIGS. 10(a), 10(b), and 10(c), a spring contact 200 of the present embodiment remains the same as that of the previous embodiment in that the spring contact 200 includes an upper contact pin 210, a lower contact pin 220 assembled to the upper contact pin 210 such that the upper and lower contact pins 210 and 220 cross each other, and a spring 230 elastically supporting the upper and lower contact pins 210 and 220, and in that the upper and lower contact pins 210 and 220 are commonly configured as a single contact pin.

The upper contact pin 210 remains the same as that of the previous embodiment in that the upper contact pin 210 includes a body portion 212 including a groove 211 that is recessed in each of opposite surfaces thereof, a shoulder protrusion 213 formed to protrude vertically from each of left and right side ends of the body portion 212, a pair of elastic portions 215 extending in a longitudinal direction of the body portion 212 to be bilaterally symmetrical to each other, a second end contact portion 216 formed at an end of each of the elastic portions 215, and a guide surface 217. In particular, the upper contact pin 210 in the present embodiment includes one first end contact portion 214 extending on the central axis.

The first end contact portion 214 includes an edge line formed by two different inclined contact surfaces that are in contact with each other. Herein, the contact surfaces may be configured as curved surfaces. Meanwhile, a height k of the first end contact portion 214 from the respective shoulder protrusions 213 may be determined in consideration of the height of the lead of the IC.

A total length of the spring contact 200 of the present embodiment configured as described above in a compressed state is equal to the length of a single contact pin. Herein, the first end contact portion 214 of the upper contact pin 210 and second end contact portions 226 of the lower contact pin 220, which define an upper end portion of the spring contact 200, come into contact with the lead 2 of the IC simultaneously at three positions 214A and 226A.

As such, the first end contact portion 214 of the upper contact pin 210 may include a single edge line or two or more edge lines depending on the lead of the IC.

Figure 13:
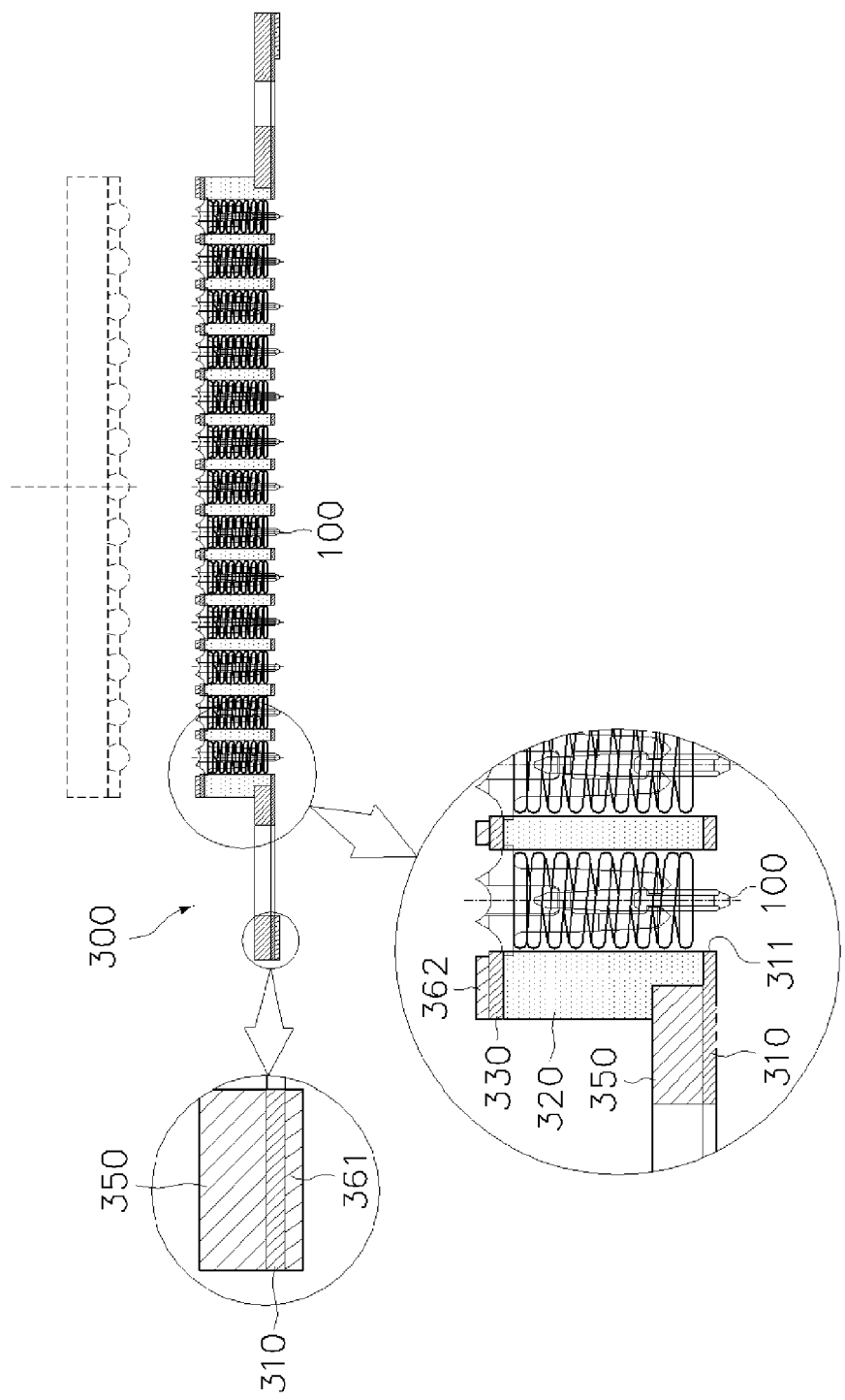
FIGS. 13 and 14 are sectional views illustrating the socket according to the embodiment of the present disclosure.

FIGS. 11(a) and 11(b) are respectively a side view and a rear view illustrating a BGA-type IC, FIG. 12 is a plan view illustrating a configuration of a socket for testing a BGA-type IC according to an embodiment of the present disclosure, and FIG. 13 is a sectional view taken along line E-E of FIG. 12.

Referring to FIGS. 12 and 13, a socket 300 according the present embodiment includes: a plurality of spring contacts 100 each of which includes an upper contact pin, a lower contact pin assembled to the upper contact pin such that the upper and lower contact pins cross each other, and a spring elastically supporting the upper and lower contact pins; a lower film plate 310 including a plurality of first through-holes 311 through which the respective spring contacts 100 are positioned; an intermediate plate 320 provided on an upper surface of the lower film plate 310 and including second through-holes formed at positions corresponding to the first through-holes 311; and an upper film plate 330 provided on an upper surface of the intermediate plate 320 and including a third through-holes formed at positions corresponding to the second through-holes.

In the present embodiment, each of the spring contacts 100 may be configured as the above-described spring contact, and two or more types of spring contacts may be used depending on a lead of an IC.

The lower film plate 310, the intermediate plate 320, and the upper film plate 330 are integrally formed to have a predetermined thickness, the through-holes of the plates are formed in a predetermined pattern, and the spring contacts 100 are inserted into the through-holes and come into contact with leads of an IC.

The lower film plate 310 may further include a reinforcing plate 350 provided on the upper surface thereof. The reinforcing plate 350 may include a socket assembly hole 351 and a guide hole 352 for guiding the socket in position. The reinforcing plate 350 may be made of metal (SUS) or resin.

A first adjustment plate 361 for height adjustment may be provided on a lower surface of the lower film plate 310. In addition, a second adjustment plate 362 for height adjustment may be provided on an upper surface of the upper film plate 330.

Preferably, the intermediate plate 320 is made of an elastomer such as silicone rubber. The intermediate plate 320 made of the elastomer may be manufactured in such a manner that a liquid resin is injected into a separate mold and is cured. Therefore, it is easy to manufacture as compared to a conventional method of injecting synthetic resin.

Figure 14:
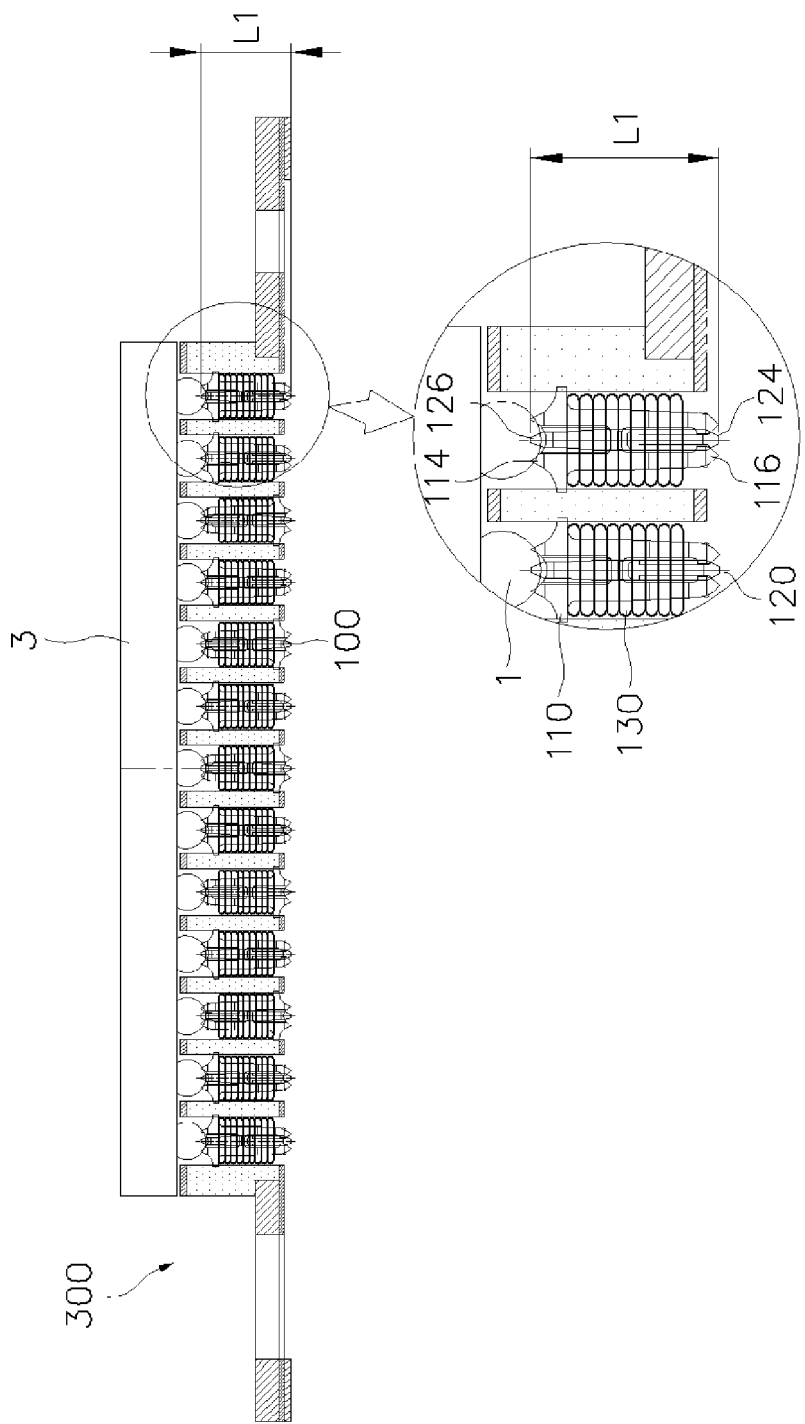

FIG. 14 is a sectional view illustrating the configuration of the socket according to the embodiment of the present disclosure, illustrating a state in which an IC 3 is loaded.

Referring to FIG. 14, the IC 3 is seated on an upper portion of the socket 300. Herein, each of the spring contacts 100 in the socket 300 is compressed in contact with each lead ball 1, and in the spring contact 100, a first tip contact portion 114 of an upper contact pin 110 and a second tip contact portion 126 of a lower contact pin 120 are simultaneously in contact with the lead ball 1 of the IC 3. In addition, a second tip contact portion 116 of the upper contact pin 110 and a first tip contact portion 124 of the lower contact pin 120 are also simultaneously in contact with a lead (not illustrated) of a PCB. Herein, a length L1 of the spring contact 100 is equal to the length of a single contact pin (see FIG. 9).

Figure 17:
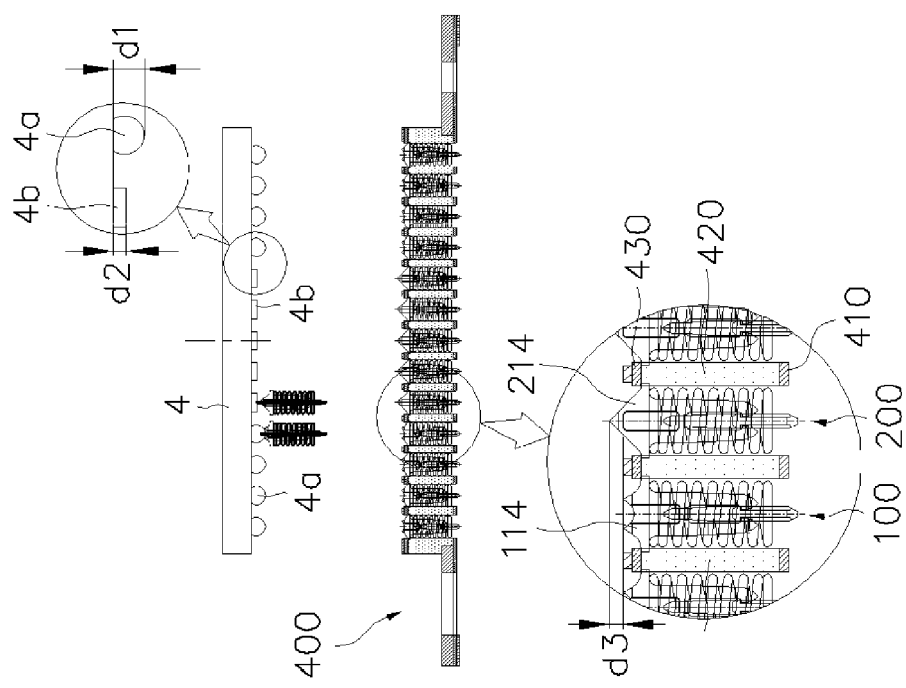
FIG. 17 is a sectional view illustrating the socket according to the embodiment of the present disclosure.

FIGS. 15(a) and 15(b) are respectively a side view and a rear view illustrating a hybrid IC in which a BGA type and a LGA type are mixed, FIG. 16 is a plan view illustrating a socket suitable for the test of a hybrid IC according to another embodiment of the present disclosure, and FIG. 17 is a sectional view taken along line F-F of FIG. 17.

Referring to FIGS. 16 and 17, a socket 400 according to the present embodiment includes a lower film plate 410, an intermediate plate 420, and an upper film plate 430. The main components of a reinforcing plate and an adjustment plate for height adjustment that can be added to the lower film plate 410 remain substantially the same as those of the previous embodiment, so a duplicate description will be omitted.

The socket 400 according to the present embodiment is characterized by including different spring contacts 100 and 200 depending on the type of a lead of a hybrid IC.

The hybrid IC 4 includes ball-type leads 4a and land-type leads 4b having different heights d1 and d2, and the socket 400 includes first spring contacts 100 and second spring contacts 200 corresponding to the leads, respectively, and having different heights in accordance with the type of the respective leads.

In the present embodiment, the first spring contacts 100 (see FIG. 6 to FIG. 9) each of which includes an upper contact pin having a pair of first end contact portions 114 are provided at positions of the ball-type leads 4a, while the second spring contacts 200 (see FIG. 10) each of which includes an upper contact pin having one first end contact portion 214 are provided at positions of the land-type leads 4b.

As described above, the spring contacts according to the present disclosure have a high degree of design freedom with respect to the height or shape of the first end contact portions at upper ends of the contact pins. For this reason, the socket 400 may include the different first and second spring contacts 100 and 200 having a height difference d3 so as to compensate for a height difference d1-d2 according to the lead type when the IC is loaded.

Although exemplary embodiments of the present disclosure have been described for illustrative purposes, those skilled in the art will appreciate that various modifications, additions, and substitutions are possible, without departing from the scope and spirit of the disclosure as defined by the appended claims.

DESCRIPTION OF THE REFERENCE NUMERALS IN THE DRAWINGS 100, 200: spring contact
110, 210: upper contact pin
111, 211: groove 112, 212: body portion
113, 213: shoulder protrusion
114, 214: first end contact portion
115, 215: elastic portion
116, 216: second end contact portion
117, 217: guide surface
120, 220: lower contact pin
130, 230: spring 300, 400: socket
310, 410: lower film plate 320, 420: intermediate plate
330, 430: upper film plate

The invention claimed is:

1. A socket comprising:
   a plurality of spring contacts each of which includes an upper contact pin, a lower contact pin assembled to the upper contact pin such that the upper and lower contact pins cross each other to mutually linearly operate, and a coil spring elastically supporting the upper and lower contact pins, wherein the upper and lower contact pins are inserted into the coil spring;
   a lower film plate including a plurality of first through-holes through which the respective spring contacts are positioned;
   an intermediate plate provided on an upper surface of the lower film plate and including second through-holes formed at positions corresponding to the first through-holes, wherein a diameter of the second through-hole is greater than or equal to a diameter of the respective coil spring; and
   an upper film plate provided on an upper surface of the intermediate plate and including third through-holes formed at positions corresponding to the second through-holes.

2. The socket of claim 1, wherein the intermediate plate is made of an elastic elastomer.

3. The socket of claim 1, wherein the spring contacts correspond to leads of an IC and have different heights.

4. The socket of claim 1, wherein the lower film plate or the upper film plate further includes an adjustment plate for height adjustment.

5. The socket of claim 1, wherein the lower film plate further includes a reinforcing plate provided around an edge thereof.

6. The socket of claim 5, wherein each of the lower film plate and the reinforcing plate includes a socket assembly hole formed therethrough.

7. The socket of claim 5, wherein each of the lower film plate and the reinforcing plate includes a guide hole formed therethrough to guide an assembly position of the socket.

8. A spring contact comprising:
   an upper contact pin;
   a lower contact pin assembled to the upper contact pin such that the upper and lower contact pins cross each other; and
   a coil spring elastically supporting the upper and lower contact pins,
   wherein the upper contact pin and the lower contact pin are plate-shaped contact pins having the same shape and fulfill a relationship of length (L1)>width (w1)>thickness (t1), and each of the upper and lower contact pins includes:
   a body portion including a groove that is recessed in each of opposite surfaces thereof in a longitudinal direction thereof, each of the respective grooves being configured such that one end thereof is open while the other end thereof has a hook locking step having a step height;
   a pair of shoulder protrusions protruding from left and right side ends of the body portion to support the coil spring;
   a first end contact portion extending from an upper end of the body portion;
   a pair of elastic portions extending in the longitudinal direction of the body portion to be bilaterally symmetrical to each other, and each of which includes a guide surface protruding inward from an end portion of each of the elastic portions such that the respective guide surfaces face each other; and
   a second end contact portion extending from an end of each of the elastic portions,
   wherein each of neighboring lower end edges of the body portion between the elastic portions includes a chamfered inclined surface having an inclination, and each of the first end contact portion and the second end contact portion includes an edge line formed by two different curved surfaces or inclined contact surfaces that are in contact with each other;
   a thickness (t2) of the body portion in a section where the respective grooves are formed is equal to or less than a width (w3) between the guide surfaces, the width (w3) between the guide surfaces is less than a thickness (t1) of the body portion, and a length (L3) of the elastic portions including the respective second end contact portions is greater than a length (L2) from the first end contact portion to a lower end of the body portion; and
   the two elastic portions of the upper contact pin and the two elastic portions of the lower contact pin are fitted to cross each other so that the guide surfaces of the upper contact pin come into contact with the grooves of the lower contact pin and the guide surfaces of the lower contact pin come into contact with the grooves of the upper contact pin, and a total length of the spring contact is equal to a length (L1) of a single contact pin when the coil spring is compressed.

9. The spring contact of claim 8, wherein the first end contact portion of each of the upper and lower contact pins is provided as at least two first end contact portions.

10. The spring contact of claim 8, wherein a width between the pair of shoulder protrusions is greater than an outer diameter of the coil spring.

* * * * *